United States Patent
Spehlmann

(10) Patent No.: US 11,092,654 B2
(45) Date of Patent: Aug. 17, 2021

(54) MEASURING A LEAKAGE CHARACTERISTIC OF A SIGNAL PATH

(71) Applicant: Teradyne, Inc., North Reading, MA (US)

(72) Inventor: Marc Spehlmann, North Reading, MA (US)

(73) Assignee: Teradyne, Inc., North Reading, MA (US)

( * ) Notice: Subject to any disclaimer, the term of this patent is extended or adjusted under 35 U.S.C. 154(b) by 82 days.

(21) Appl. No.: 16/456,666

(22) Filed: Jun. 28, 2019

(65) Prior Publication Data

US 2020/0408824 A1 Dec. 31, 2020

(51) Int. Cl.
*G01R 31/50* (2020.01)

(52) U.S. Cl.
CPC .................................. *G01R 31/50* (2020.01)

(58) Field of Classification Search
USPC ....... 324/500, 512, 522, 600, 629, 633, 635, 324/642, 644, 649, 658, 661–663, 671, 324/699, 713, 715, 716; 702/1, 52, 57, 702/64
See application file for complete search history.

(56) References Cited

U.S. PATENT DOCUMENTS

| | | | |
|---|---|---|---|
| 7,786,718 B2 | 8/2010 | Spehlmann | |
| 8,773,157 B2 | 7/2014 | Badaroglu et al. | |
| 8,847,605 B2* | 9/2014 | Morita | G01R 31/66 324/538 |
| 9,784,555 B2 | 10/2017 | Spehlmann | |
| 9,857,407 B2* | 1/2018 | Lu | G06F 3/0418 |
| 2003/0193051 A1* | 10/2003 | Beech | H01L 22/34 257/48 |
| 2009/0167381 A1 | 7/2009 | Spehlmann | |
| 2012/0286814 A1 | 11/2012 | Wang et al. | |
| 2016/0178667 A1 | 6/2016 | Spehlmann et al. | |
| 2016/0200209 A1* | 7/2016 | Tabatowski-Bush | B60L 3/0069 701/22 |
| 2017/0097384 A1* | 4/2017 | Yamada | H02J 7/0047 |
| 2017/0146332 A1 | 5/2017 | Spehlmann | |
| 2018/0375387 A1* | 12/2018 | Oshima | G01R 31/50 |

(Continued)

FOREIGN PATENT DOCUMENTS

| | | |
|---|---|---|
| CN | 104880609 B | 4/2018 |
| JP | 2007-172766 A | 7/2007 |
| WO | 2018002634 A1 | 1/2018 |

OTHER PUBLICATIONS

International Search Report received for International Patent Application No. PCT/US2020/032568, 3 pages, dated Aug. 27, 2020.

(Continued)

*Primary Examiner* — Tung X Nguyen
*Assistant Examiner* — Robert P Alejnikov, Jr.
(74) *Attorney, Agent, or Firm* — Burns & Levinson

(57) ABSTRACT

The systems determine the parasitic capacitance of a signal path. That parasitic capacitance is then used to determine a leakage characteristic of the signal path, such as leakage current or leakage resistance. The capability of ATE channels to force current accurately, and to measure time intervals at prescribed voltages, can be used to multiply the accuracy of the force current function. Using these resources, small leakage currents—for example, on the order of 10 nA or less—can be measured.

20 Claims, 3 Drawing Sheets

(56) References Cited

U.S. PATENT DOCUMENTS

2019/0126936 A1* 5/2019 Murashima ............ G01C 25/00
2019/0202199 A1* 7/2019 Bird .................... B41J 2/04541
2020/0110122 A1* 4/2020 Wakimoto ............. G01R 31/52

OTHER PUBLICATIONS

Written Opinion received for International Patent Application No. PCT/US2020/032568, 6 pages, dated Aug. 27, 2020.
Dascher, D.J., Keysight Technologies Measure Parasitic Capacitance and Inductance Using TDR, 23 pages (Dec. 1, 2017).
Huffman, B., Parasitic Capacitance Effects in Step-Up Transformer Design, Linear Technology, Application Note 39, 4 pages (Feb. 1990).
Parasitic capacitance, Wikipedia, 3 pages [retrieved Jun. 28, 2019]. URL: https://en.wikipedia.org/wiki/Parasitic_capacitance.

* cited by examiner

MEASURING A LEAKAGE CHARACTERISTIC OF A SIGNAL PATH

TECHNICAL FIELD

This specification describes example systems configured to measure a leakage characteristic of a signal path.

BACKGROUND

Test systems are configured to test the operation of electronic devices and electronic systems. Testing may include sending signals to a device over a test channel and determining how the device reacted to those signals based on its response. The reaction will dictate whether the device has passed or failed testing.

Test channels have leakage characteristics, such as leakage current and leakage resistance. These leakage characteristics can affect testing. For example, some digital devices have signals that can operate deterministically when disconnected. The presence of leakage on such a signal may force the device into an unknown state which can adversely impact testing. Device manufacturers therefore may want to know the leakage specifications of a test system before using the test system.

Electronic devices also have leakage. Device manufacturers may require measurements of those leakages.

SUMMARY

An example method measures a leakage characteristic of a signal path. The example method includes forcing a current onto the signal path; determining a parasitic capacitance of the signal path based on a rate of change of a voltage on the signal path resulting from the current; forcing a voltage onto the signal path for a period of time; and following the period of time, determining the leakage characteristic based on the parasitic capacitance and a rate of change in voltage on the signal path from the forced voltage. The example method may include one or more of the following features, either alone or in combination.

The leakage characteristic may include a leakage resistance. The leakage characteristic may include a leakage current. The leakage characteristic may include both a leakage resistance and a leakage current.

Each rate of change of the voltage may be determined by a test instrument that measures time at different voltages on the signal path. Each rate of change of the voltage may be determined by a test instrument that measures the voltage on the signal path at different times. The signal path may float following the period of time.

The example method may include determining each rate of change of the voltage on the signal path. The signal path may include a conduit within test equipment. The signal path may include an interface between test equipment and a device under test by the test equipment. The signal path may include the device under test.

An example system is configured to measure a leakage characteristic of a signal path. The example system includes a voltage source connected to the signal path; a current source connected to the signal path; circuitry to measure voltage on the signal path at time intervals; and a control system configured (i) to control the current source to force a current onto the signal path, (ii) to determine a parasitic capacitance of the signal path based on a rate of change of a voltage on the signal path measured by the circuitry and resulting from the current, (iii) to control the voltage source to force a voltage onto the signal path for a period of time, and (iv) following the period of time, to determine the leakage characteristic based on a rate of change in voltage on the signal path resulting from the forced voltage. The example system may include one or more of the following features, either alone or in combination.

The leakage characteristic may include a leakage resistance. The leakage characteristic may include a leakage current. The leakage characteristic may include both the leakage resistance and the leakage current.

The circuitry may be configured to measure each rate of change of the voltage on the signal path by measuring a voltage difference over an interval of time. The circuitry may be configured to measure each rate of change of the voltage on the signal path at different times between different voltage thresholds.

The voltage on the signal path may float following the period of time. The signal path may include a conduit within test equipment. The signal path may include an interface between test equipment and a device under test by the test equipment. The signal path may include the device under test.

Any two or more of the features described in this specification, including in this summary section, may be combined to form implementations not specifically described in this specification.

At least part of the test systems and processes described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the test systems and processes described in this specification may be configured or controlled using a computing system comprised of one or more processing devices and memory storing instructions that are executable by the one or more processing devices to perform various control operations.

The details of one or more implementations are set forth in the accompanying drawings and the following description. Other features and advantages will be apparent from the description and drawings, and from the claims.

DESCRIPTION OF THE DRAWINGS

Like reference numerals in different figures indicate like elements.

DETAILED DESCRIPTION

Figure 1:
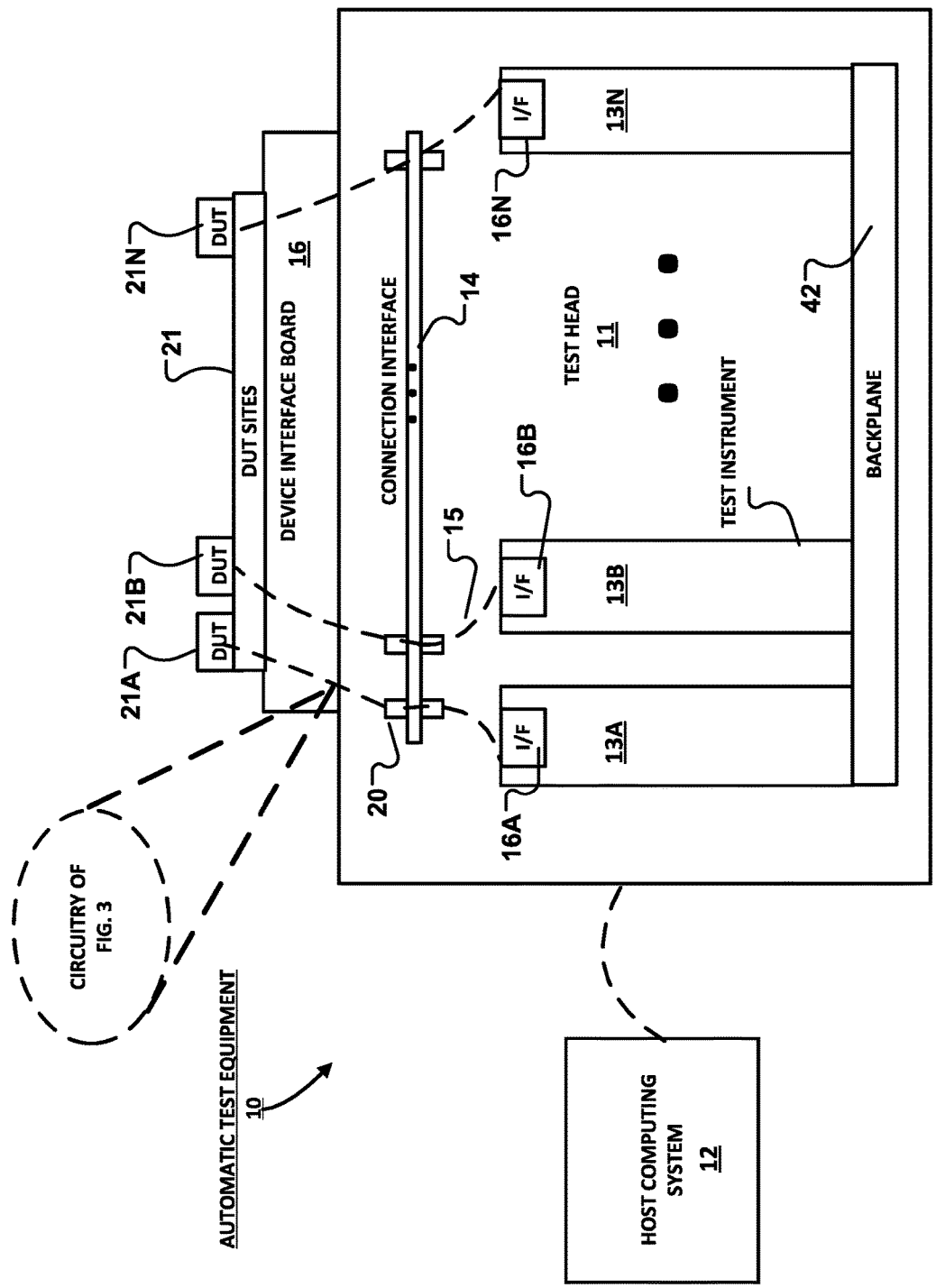
FIG. 1 is a block diagram of components of an example test system on which the processes described herein for measuring a leakage characteristic may be used.

Described herein are example systems for measuring the leakage of a signal path, such as a test channel, through a test instrument, an interface circuit, and/or a device under test (DUT). In automatic test systems (ATE), leakage may be characterized in terms of resistance and/or current on the test channel.

The systems described herein take advantage of small parasitic capacitances inherent in all electrical signal paths, such as test channels, in order to measure leakage characteristics of those signal paths. In general, parasitic capacitance includes inherent capacitance that exists between parts of an electronic component or circuit as a result of their relatively close proximity. Parasitic capacitances are generally undesirable, so test system designers try to minimize their magnitude. For example, parasitic capacitances may be on the order for 0.5 nanofarads (nF) or less. The small magnitudes of parasitic capacitances in a signal path make parasitic capacitance useful for measuring small currents, such as currents that are at or below ten nanoamperes (10 nA). In some examples, leakage currents at or below 1 nA may be measured. Also, the relative difference between leakages may be measured with high resolution. For example, differences in leakage measurements of 10 picoamperes (pA) or less may be resolved.

The systems described herein determine the parasitic capacitance of a signal path. That parasitic capacitance is then used to determine a leakage characteristic of the signal path, such as leakage current or leakage resistance. In this regard, the capability of ATE channels to force current accurately, and to measure time intervals at prescribed voltages, can be used to multiply the accuracy of the force current function. Using these resources, small leakage currents—for example, on the order of 10 nA or less—can be measured by implementing the following operations.

Initially, a small current is injected onto a signal path of interest. The current into the capacitance of the signal path will cause the voltage on the signal path to change. The rate of change of this voltage on the signal path is dependent on the magnitude of the injected current and on the parasitic capacitance of the signal path. This rate can be measured using the functionality of the test instrument to measure voltages at a specified time interval or to measure times at specified voltage levels. Once the rate of voltage change is known, the parasitic capacitance of the signal path is determined. Next, the signal path is forced to an initial voltage and then allowed to float. Floating, in this example, includes stopping the forcing of voltage or current to the signal path. In the floating state, the rate of change of the voltage on the signal path is measured. Since leakage may be characterized as a resistance rather than a current, the leakage resistance is calculated using the parasitic capacitance and the change in the voltage. Leakage resistance may be defined by leakage current measured at a particular voltage. Over a voltage range where the leakage resistance is linear, leakage currents can then be determined for any voltage in the range using Ohm's law.

An example test system may be configured to implement the foregoing technique for measuring a leakage characteristic of a signal path. The example test system may include a voltage source connected to a signal path such as a test channel, a current source connected to the signal path, and circuitry to measure voltage on the signal path at time intervals or circuitry to measure time at voltage levels. A control system, such as a computing system, is configured—for example programmed—(i) to control the current source to force a current onto the signal path, (ii) to determine a parasitic capacitance of the signal path based on a change in voltage over time on the signal path measured by the circuitry and resulting from the current, (iii) to control the voltage source to force a voltage onto the signal path for a period of time, and (iv) following the period of time, then to determine the leakage characteristic based on a change in voltage over time on the signal path and based on the parasitic capacitance.

FIG. 1 shows components of example ATE 10 configured to measure a leakage characteristic of a signal path. The techniques described herein, however, are not limited to use with the test system shown in FIG. 1 or to test systems in general. Rather, the techniques may be used to measure leakage characteristics in any appropriate technological context. For example, the techniques may be used in any technological context where power dissipation is a concern in order to measure leakage currents that affect the power dissipation. In FIG. 1, the dashed lines represent, conceptually, potential signal paths between components of the system.

ATE 10 includes a test head 11 and a host computing system 12. The host computing system is a control system in this example. The host computing system may include a computing system comprised of one or more microprocessors or other appropriate processing devices as described herein. A device interface board (DIB) 16, which is described below, is connected to a test head 11 and includes interfaces to one or more DUTs 21A to 21N on which tests are performed by the ATE.

In the example of FIG. 1, DIB 16 connects, electrically and mechanically, to test head 11. The DIB includes sites 21, which may include pins, conductive traces, or other points of electrical and mechanical connection to which DUTs may connect. Test signals, response signals, and other signals pass via test channels over the sites between the DUTs and test instruments. DIB 16 may also include, among other things, connectors, conductive traces, and circuitry for routing signals between the test instruments, DUTs connected to sites 21, and other circuitry.

Host computing system 12 communicates with components of the test head to control testing. For example, host computing system 12 may download test program sets to test instruments 13A to 13N in the test head. The test instruments are hardware devices that may include one or more processing devices and other circuitry. Test instruments 13A to 13N may run the test program sets to test DUTs in communication with the test instruments. Host computing system 12 may also send, to test instruments in the test head, instructions, test data, and/or other information that are usable by the corresponding test instrument to perform appropriate tests on a DUT interfaced to the DIB. In some implementations, this information may be sent via a computer or other type of network. In some implementations, this information may be sent via a computer network, such as a local area network (LAN) or a wide area network (WAN).

In the example of FIG. 1, ATE 10 includes multiple test instruments 13A to 13N, each of which may be configured, as appropriate, to perform one or more of testing and/or other functions. Although only three test instruments are depicted, the system may include any appropriate number of test instruments, including those residing outside of test head 11. In some implementations, each test instrument may be configured to output test signals to test a DUT based, e.g., on data provided by the host computing system, and to receive response signals from the DUT. Different test instruments may be configured to perform different tests and/or be configured to test different DUTs. The received signals may include response signals that are based on the test signals and/or signals that originate from the DUT that are not prompted by (e.g., are not in response to) test signals. In some implementations, there may be electrical conductors, such as copper wires, between the DUT, the DIB, and the test instrument interfaces over which test and response signals are sent.

In this example, one or more of the test instruments are VI (voltage-current) test instruments configured to force direct current (DC) voltage and to force DC current onto a test channel and to receive signals from the device based on the forced DC voltage and forced DC current. However, other types of test instruments may be included in addition to VI test instruments. For example, test instruments may be used that are configured to source and to detect high-speed digital signals.

Signals may be sent to, and received from, the DUT over multiple test channels. In some examples, a test channel may include the physical transmission medium or media over which signals are sent from the test instrument to a DUT and over which signals are received from the DUT. Physical transmission media may include electrical conductors alone or in combination with other types of media. The example processes described herein for measuring leakage characteristic are typically performed on electrical conductors that are part of or that constitute a test channel.

Each test instrument has a corresponding interface (I/F) circuit 16A to 16N for outputting signals to, and receiving signals from, a corresponding DUT. In some implementations, each interface circuit may be implemented using a device, such as an FPGA, an application-specific integrated circuit (ASIC), or other appropriate hardware. Input circuitry and output circuitry for a test instrument may reside in the interface of each test instrument. In this regard, each test instrument may include input circuitry for receiving signals from one or more DUTs or other appropriate signal source(s). Each test instrument may also include output circuitry for outputting signals to a communication channel defined by the test instrument.

In the implementation of FIG. 1, test instruments 13A to 13N may be interconnected through backplane 42 or any other appropriate electrical or mechanical mechanism. For example, test instruments 13A to 13N may mechanically interface, e.g., plug into, backplane 42 of FIG. 1. Backplane 42 may include one or more transmission media over which signals pass among the various components of FIG. 1, including the test instruments and the test computer/host computing system. In some implementations, the transmission media may be, or include, one or more serial buses such as a peripheral component interconnect express (PCIe) bus, Ethernet cable, or appropriate types of copper or other conductive transmission media.

In some examples, ATE 10 includes a connection interface 14 that connects test instrument test channels 15 to a DIB 16. Connection interface 14 may include connectors 20 or other devices for routing signals between the test instruments and DIB 16. For example, the connection interface may include one or more circuit boards or other substrates on which such connectors are mounted. Conductors that define the test channels may be routed through the connection interface and the DIB.

Figure 2:
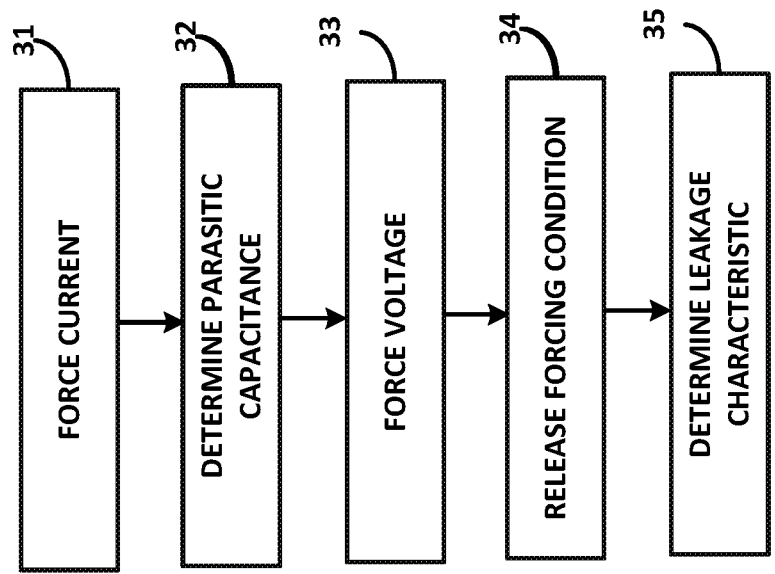
FIG. 2 is a flowchart showing operations included in an example process for measuring a leakage characteristic of an instrument test channel.

FIG. 2 shows at least some of the operations included in an example process 30 for determining a leakage characteristic of a signal path, such as a test channel, using the parasitic capacitance on that signal path. Process 30 may be used to measure leakage of an ATE channel in a high impedance state, but is not limited to use in this context, as explained herein. Process 30 may be controlled using a computing system, such as host computing system 12. For example, the host computing system may control one or more test instruments to force current and voltage onto a test channel as described below. The host computing system may perform the calculations below to determine the leakage characteristic.

In this example implementation, process 30 includes forcing (31) a current onto the signal path. In an example, an initial voltage is forced onto the signal path. The forced voltage is switched to forced current; that is, current is forced onto the signal path. This current will cause the voltage on the signal path to rise or to fall. Two voltage comparators may connected to the signal path. These voltage comparators are programmed—for example, by the host computing system 12—to detect voltage thresholds ("voltage thresholds" are synonymous with "voltage levels") within a range of the rising or falling voltage on the signal path. The time it takes for the voltage changing on the signal path to cross these two voltage thresholds is determined by the host computing system 12 and stored in computer memory. The voltage thresholds may be set based on physical characteristics of the test system and the DUT. For example, a voltage operational range for the system may be known and two voltage thresholds may be selected that are within the that operational range. In another example, a voltage measuring circuit is connected to the signal path. Two or more voltage measurements are taken at known time intervals. The change in voltage over these intervals is determined by the host computing system 12 and stored in computer memory.

Process 30 includes determining (32) a parasitic capacitance of the signal path based on a rate of change of the voltage on the signal path resulting from the forced current. Since the forced current does not change across the voltage thresholds of the comparators, the parasitic capacitance, C, of the signal path can be determined as follows.

$$C = I_{prog} * dt/dV,$$

where dt is defined as $(t_{compA} - t_{compB})$, where $t_{compA}$ and where $t_{compB}$ are the times when the programmed comparator voltage thresholds are crossed. Above, dV is defined as $(V_{compA} - V_{compB})$, where $V_{compA}$ and $V_{compB}$ are the voltage thresholds to which the comparators are programmed. Alternatively, dV may be defined as the difference between two voltage measurements and dt is defined as the interval over which the two measurements are taken. $I_{prog}$ is the current forced on the signal path.

Process 30 includes forcing (33) a voltage onto the signal path for a period of time. The period of time may be based on the length of the signal path under consideration, among other factors. In an example, forcing includes forcing an initial voltage onto the signal path, then releasing the forcing condition (34)—that is, ending the forced voltage onto the signal path. Leakage will pull the signal path generally towards electrical ground. The resulting rate of change of the voltage on the signal path is measured. Then, the leakage characteristic is determined (35) based on the change in voltage on the signal path and based on the parasitic capacitance. In an example, to determine the change in voltage, two comparators connected to the signal path are programmed to voltage thresholds that will be crossed as the voltage on the signal path changes. The time interval between when the comparator voltage thresholds are crossed is determined. In this example, the leakage characteristic is leakage resistance. The equation to determine the leakage resistance, R, for the signal path is as follows.

$$R_L = (t_{leakA} - t_{leakB})/(C^*(\ln(V_{leakA}/V_{init}) - \ln(V_{leakB}/V_{init}))),$$

where $V_{leakA}$ and $V_{leakB}$ are the voltage thresholds to which the comparators are programmed, $t_{leakA}$ and $t_{leakB}$ are the times at which the comparator voltages thresholds are crossed, $V_{init}$ is the initial voltage to which the node is forced, and "ln" is the natural logarithm function. In another example, the rate of change of a voltage is determined by taking voltage measurements at known intervals of time. In this case, ($t_{leakA}$–$t_{leakB}$) is the known interval, while $V_{leakA}$ and $V_{leakB}$ are two voltage measurements.

As noted, the host computing system may perform the calculations and store $R_L$ in computer memory. The host computing system may determine the leakage current, $I_L$, at any given time based on R and the voltage on the signal path at that time using Ohm's law. The host computer system may also store $I_L$ in computer memory. $R_L$ and $I_L$ may become specifications of the test system and may be useful in determining which DUTs should be tested by the test system and which DUTs should not be tested by the test system. As above, the voltage thresholds may be set based on physical characteristics of the test system and the DUT. For example, a voltage operational range for the system may be known and two voltage thresholds may be selected that are within the that operational range. The determination of the rate of change of a voltage may require a minimum of two measurements. More than two measurements may be taken to improve accuracy by averaging, or to determine leakages for signals of which the leakage path is not known. For example, a common voltage used by electronic devices is 5 volts (V). Signals may have leakage paths to 5V or an intermediate voltage, or to any voltage present within the test system. In some implementations, in the case where the leakage path is not known, a minimum of three measurements can be used to determine the leakage of the signal path.

Leakage (for example, $R_L$ or $I_L$) on an electrical signal path can be anywhere along the electrical signal path. For example, leakage can be on the signal path between a test instrument and the DUT, on the signal path between the test instrument and the DIB, on the signal path between the DIB and the DUT, within the DUT, within the DIB, and/or within the test instrument. Such leakage can be measured separately, for example, by disconnecting the path of interest, measuring a baseline leakage, then connecting the path of interest and taking measurements again. The difference between the two measurements is the leakage on the path of interest. For example, process 30 may be used differentially to measure DIB or DUT leakage. For example, referring to FIG. 3, to measure DUT leakage, a baseline measurement of leakage to a DUT 40 is made by removing the DUT from the instrument channel 41. Then, a leakage measurement with the DUT connected to the instrument channel (via switch 47, for example) is performed and the baseline is subtracted to obtain the contribution of the leakage from the DUT itself. For example, to measure DIB leakage, a baseline measurement of leakage to the DIB is made by removing the DIB from the instrument channel, for example, by disconnecting the DIB from the test head. Then, a leakage measurement with the DIB connected to the test head is performed and the baseline is subtracted from that measurement to obtain the contribution of the leakage from the DIB itself. Other difference calculations of this type may be used to determine other sources of leakage.

Figure 3:
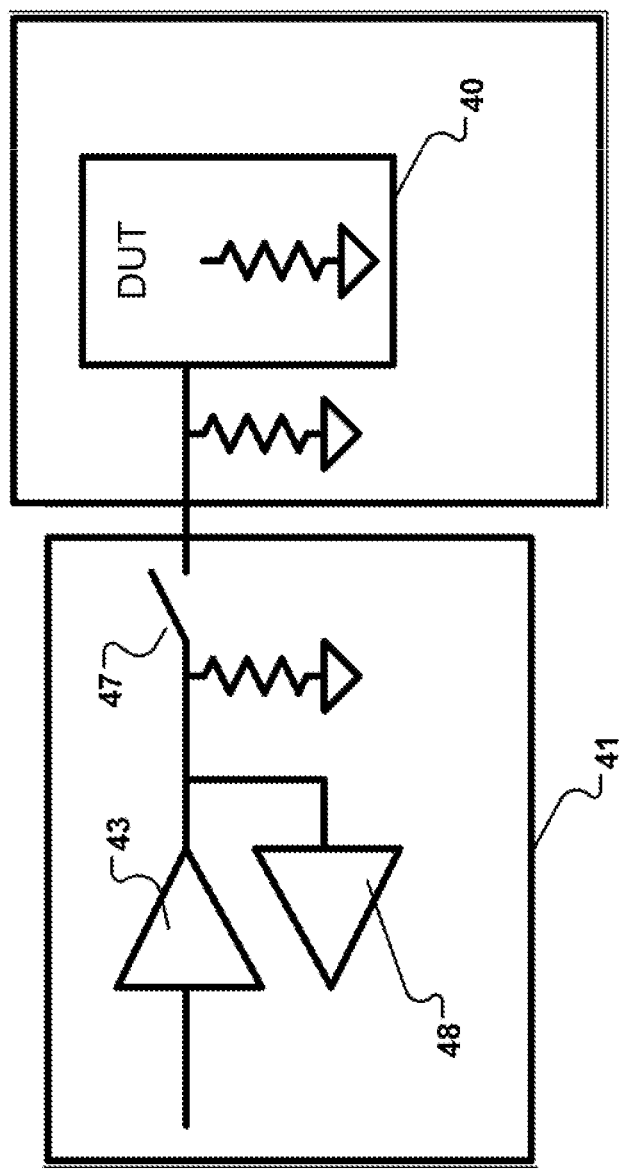
FIG. 3 is an example circuit diagram showing a device under test electrically disconnected from an instrument test channel.

FIG. 3 also shows comparators 48 and 43, which each may represent one or more comparators connected to the signal path that are described with respect to FIG. 2.

Thus, described herein are example test system that are configured to measure a leakage characteristic of a signal path. Examples of such test systems include ATE. Examples of the leakage characteristic include leakage current and leakage resistance. Examples of signal paths include a test instrument used to test a DUT, a DIB used to interface the test instrument to the DUT, and the DUT itself, or a combination of two or more of these. For example, the signal path may include one or more electrical conductors in the test instrument, in the DIB, or in the DUT.

All or part of the test systems and processes described in this specification and their various modifications may be configured or controlled at least in part by one or more computers such as host computing system 12 using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the test systems and processes can be performed by one or more programmable processors executing one or more computer programs to control all or some of the well formation operations described previously. All or part of the test systems and processes can be configured or controlled by special purpose logic circuitry, such as, an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. A method of measuring a leakage characteristic of a signal path, comprising:

forcing a current onto the signal path;
determining a parasitic capacitance of the signal path based on a rate of change of a first voltage on the signal path resulting from the current;
forcing a second voltage onto the signal path for a period of time; and
following the period of time, determining the leakage characteristic based on the parasitic capacitance and a rate of change in the second voltage on the signal path, where the leakage characteristic comprises a measurement of an electrical parameter characterized by current or resistance that pulls the signal path towards ground.

2. The method of claim 1, wherein the leakage characteristic comprises a leakage resistance.

3. The method of claim 1, wherein the leakage characteristic comprises a leakage current.

4. The method of claim 1, wherein rates of change of the first voltage and the second voltage i-s are determined by a test instrument that measures time at different voltages on the signal path.

5. The method of claim 1, wherein rates of change of the first voltage and the second voltage are determined by a test instrument that measures the signal path at different times.

6. The method of claim 1, wherein the second voltage on the signal path floats following the period of time.

7. The method of claim 6, further comprising:
determining rates of change of the first voltage and the second voltage on the signal path.

8. The method of claim 1, wherein the signal path comprises a conduit within test equipment.

9. The method of claim 1, wherein the signal path comprises an interface between test equipment and a device under test by the test equipment.

10. The method of claim 1, wherein the signal path comprises a device under test.

11. A system comprising:
a voltage source connected to a signal path;
a current source connected to the signal path;
circuitry to measure voltage on the signal path at time intervals; and
a control system configured (i) to control the current source to force a current onto the signal path, (ii) to determine a parasitic capacitance of the signal path based on a rate of change of a first voltage on the signal path measured by the circuitry and resulting from the current, (iii) to control the voltage source to force a second voltage onto the signal path for a period of time, and (iv) following the period of time, to determine a leakage characteristic based on a rate of change in the second voltage on the signal path, where the leakage characteristic comprises a measurement of an electrical parameter characterized by current or resistance that pulls the signal path towards ground.

12. The system of claim 11, wherein the leakage characteristic comprises a leakage resistance.

13. The system of claim 11, wherein the leakage characteristic comprises a leakage current.

14. The system of claim 11, wherein the circuitry is configured to measure rates of change of the first voltage and the second voltage on the signal path by measuring a voltage difference over an interval of time.

15. The system of claim 11, wherein the circuitry is configured to measure rates of change of the first voltage and the second on the signal path at different times between different voltage thresholds.

16. The system of claim 11, wherein the second voltage on the signal path floats following the period of time.

17. The system of claim 16, wherein the leakage characteristic comprises both a leakage resistance and a leakage current.

18. The system of claim 11, wherein the signal path comprises a conduit within test equipment.

19. The system of claim 11, wherein the signal path comprises an interface between test equipment and a device under test by the test equipment.

20. The system of claim 11, wherein the signal path comprises a device under test.

* * * * *